(12) United States Patent
Yang et al.

(10) Patent No.: US 10,770,600 B2
(45) Date of Patent: Sep. 8, 2020

(54) METHOD OF USING THE PHOTODETECTING DEVICE

(71) Applicant: NATIONAL CHIAO TUNG UNIVERSITY, Hsinchu (TW)

(72) Inventors: Yuh-Shyong Yang, Hsinchu (TW); Chien-Hung Chen, Hsinchu (TW); Chih-Heng Lin, Hsinchu (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 16/450,992

(22) Filed: Jun. 24, 2019

(65) Prior Publication Data
US 2019/0319138 A1 Oct. 17, 2019

Related U.S. Application Data

(62) Division of application No. 14/958,917, filed on Dec. 3, 2015, now Pat. No. 10,381,495.

(30) Foreign Application Priority Data

Aug. 4, 2015 (TW) .............................. 104125266 A (51) Int. Cl.
*H01L 31/0216* (2014.01)
*H01L 31/0352* (2006.01)
(Continued)

(52) U.S. Cl.
CPC .................. *H01L 31/02162* (2013.01); *H01L 31/035227* (2013.01); *H01L 31/1129* (2013.01);
(Continued)

(58) Field of Classification Search
CPC ....... H01L 31/02162; H01L 31/035227; H01L 31/1129
See application file for complete search history.

(56) References Cited

U.S. PATENT DOCUMENTS 8,154,063 B2 4/2012 Kim et al.
8,766,272 B2 7/2014 Yu et al.
(Continued)

FOREIGN PATENT DOCUMENTS

CN 1842704 A 10/2006
CN 101145587 A 3/2008
(Continued)

OTHER PUBLICATIONS

Hsing-Chen Wu et al., "Photoinduced Electron Transfer in Dye-Sensitized SnO2 Nanowire Field-Effect Transistors", Advanced Functional Materials, vol. 21, pp. 474-479, 2011.
(Continued)

*Primary Examiner* — Brian R Gordon
*Assistant Examiner* — Dwan A Gerido
(74) *Attorney, Agent, or Firm* — CKC & Partners Co., LLC (57) ABSTRACT

A photodetecting device and method of using the same are provided. Light is used to irradiate the optical filter layer of the photodetecting device and positions of the electrons and the holes in the polycrystalline silicon nano-channel layer are rearranged by the light with a wavelength range capable of passing through the optical filter layer. The current between the source and the drain is changed by rearranging the positions of the electrons and the holes, so as to generate a current difference. The intensity of the light is calculated by the current difference.

4 Claims, 8 Drawing Sheets

(51) Int. Cl.
  *H01L 31/112* (2006.01)
  *H01L 31/0368* (2006.01)
  *H01L 31/113* (2006.01)
  *H01L 31/0232* (2014.01)

(52) U.S. Cl.
  CPC .. *H01L 31/02327* (2013.01); *H01L 31/03685* (2013.01); *H01L 31/1136* (2013.01)

(56) References Cited

U.S. PATENT DOCUMENTS

| | | | |
|---|---|---|---|
| 8,810,808 | B2 | 8/2014 | Wober |
| 2007/0057144 | A1 | 3/2007 | Asano |
| 2010/0300530 | A1 | 12/2010 | Kim et al. |
| 2011/0217811 | A1 | 9/2011 | Tanaka et al. |
| 2014/0103295 | A1 | 4/2014 | Wang et al. |

FOREIGN PATENT DOCUMENTS

| | | |
|---|---|---|
| CN | 102650709 A | 8/2012 |
| KR | 20040095079 A | 12/2004 |
| KR | 20050054056 A | 6/2005 |
| TW | I294183 | 3/2008 |
| WO | 2010007333 A1 | 1/2010 |
| WO | 2014088244 A1 | 6/2014 |

OTHER PUBLICATIONS

Minhyeok Choe et al., "Characteristics of light-induced electron transport from P3HT to ZnO-nanowire field-effect transistors", Applied Physics Letters, vol. 103 , pp. 223305-1-223305-4, 2013.

Gui Chen et al., "Single-Crystalline p-Type Zn3As2 Nanowires for Field-Effect Transistors and Visible-Light Photodetectors on Rigid and Flexible Substrates", Advanced Functional Materials, vol. 23, pp. 2681-2690, 2013.

Shaygan Mehrdad et al., "Single-crystalline CdTe nanowire field effect transistors as nanowire-based photodetector", Phys. Chem. Chem. Phys., vol. 16, pp. 22687-22693, 2014.

Wu et al., "Photoinduced electron transfer in dye-sensitized SnO2 nanowire field-effect transistors", Advanced Functional Materials, 2011, vol. 21, pp. 474-479.

METHOD OF USING THE PHOTODETECTING DEVICE

RELATED APPLICATIONS

The present application is a Divisional Application of the U.S. application Ser. No. 14/958,917, filed Dec. 3, 2015, which claims priority to Taiwan Application Serial Number 104125266, filed on Aug. 4, 2015, all of which are herein incorporated by reference.

BACKGROUND

Field of Disclosure

The present disclosure relates to a photodetecting device and use thereof, and more particularly, to a photodetecting device and a method of using the same for photo detection.

Description of Related Art

A photosensor (also called as photodetector) is one of the most common elements used in the modern electronic products, such as digital cameras, light sensors and photo-counters. The photosensor is a sensor that uses a photosensitive element to convert light signals into electrical signals, and the common photosensitive element includes, for example, a photodiode, a photoconductor and a junction photodiode. The photoconductor is mainly a semiconductor material, which has ohmic contacts at the two terminals thereof; when incident light irradiates the surface of the semiconductor, electron-hole pairs are generated, causing the conductivity to increase, and the photoelectric current (Iph) increases accordingly. For the photodiode, the photons irradiate to the diode depletion region, and the electron-hole pairs generated thereby undergo opposite potentials of the two terminals, such that the electrons and the holes are separated and move, thus forming photoelectric current phenomenon; if a current amplifier is integrated externally, the photoelectric current can be correctly measured, and the current and the number of absorbed photons can be evaluated. The main design purpose of the junction photodiode is to be used for optical communications and to use the energy gap difference of different materials, such as indium phosphide (InP) and indium gallium arsenide (InGaAs), to separate the electron-hole pairs generated by the light energy, and to allow the electrons to move toward the n+ terminal to become a photoelectric current.

However, because the characteristics of the photodiode is often limited by the material selected during the fabricating process, different photosensors often need to be selected to perform photo detection. In practice, most applications need to use different photosensors to perform experiments. For example, when photosensors are used to perform a bioluminescence reaction experiment, a photosensor with high sensitivity and a photosensor with wide optical waveband are both needed to perform the experiment. However, the photosensor with high sensitivity results in signal saturation easily when operated for observation of normal light source, while when the photosensor with normal sensitivity is used to observe weak luminescence reaction, it often needs to extend the exposure time and integral time of the photosensor for obtaining required information. However, many experimental results also indicate that the measured signals are all noise data due to over-adjusted exposure time or integral time. As for the current technology, the effect is achieved via external optical design or installing another component, such as a photomultiplier tube. However, such device often requires larger experimental space and environment, thus having certain limitations for experimental implementation.

Therefore, a photodetecting device currently needs to be developed, which can adjust various parameters itself, so as to improve the sensitivity thereof and further achieve multifarious application fields.

SUMMARY

One aspect of the present disclosure is to provide a photodetecting device, which includes a transistor, a silicon nano-channel and a filter dye layer. The transistor includes a source, a drain and a gate. The silicon nano-channel connects the source and the drain, and is configured to receive light. The filter dye layer is over a light-receiving surface of the silicon nano-channel.

In one embodiment of the present disclosure, the transistor is a back-gated transistor, a site-gated transistor or a liquid-gated transistor.

In one embodiment of the present disclosure, the material of the silicon nano-channel is polycrystalline silicon.

In one embodiment of the present disclosure, the width of the silicon nano-channel is about 50-100 nm.

In one embodiment of the present disclosure, the thickness of the silicon nano-channel is about 1-100 nm.

In one embodiment of the present disclosure, the photodetecting device further includes an isolation layer between the gate and the silicon nano-channel.

Another aspect of the present disclosure is to provide a method of using the abovementioned photodetecting device for photo detection, including using light to irradiate the filter dye layer of the photodetecting device and rearranging the positions of the electrons and the holes in the silicon nano-channel by the light with a wavelength range passing through the filter dye layer. The positions of the electrons and the holes are rearranged changing the current between the source and the drain, so as to generate a current difference. The light intensity is calculated by the current difference.

In one embodiment of the present disclosure, the method further includes reacting a sample with a receptor to generate light.

In one embodiment of the present disclosure, the method further includes modifying the receptor on the filter dye layer.

In one embodiment of the present disclosure, the method further includes before irradiating the filter dye layer of the photodetecting device by the light, applying a voltage on the gate to rearrange the positions of the electrons and the holes in the silicon nano-channel so as to form a stable current between the source and the drain.

The photodetecting device and the method of using the photodetecting device for photo detection of the present disclosure use the silicon nano-channel to receive light and then change the current of the transistor, convert the light signals into the electrical signal and calculate the light intensity by the electrical signals, thereby detecting the light.

BRIEF DESCRIPTION OF THE DRAWINGS

The present disclosure can be more fully understood by reading the following detailed description of the embodiment, with reference made to the accompanying drawings as follows.

DETAILED DESCRIPTION

The present disclosure is described by the following specific embodiments. Those with ordinary skill in the arts can readily understand the other advantages and functions of the present disclosure after reading the disclosure of this specification. The present disclosure can also be implemented with different embodiments. Various details described in this specification can be modified based on different viewpoints and applications without departing from the scope of the present disclosure.

Reference will now be made in detail to the embodiments of the present disclosure, examples of which are illustrated in the accompanying drawings. Wherever possible, the same reference numbers are used in the drawings and the description to refer to the same or like parts.

Figure 1:
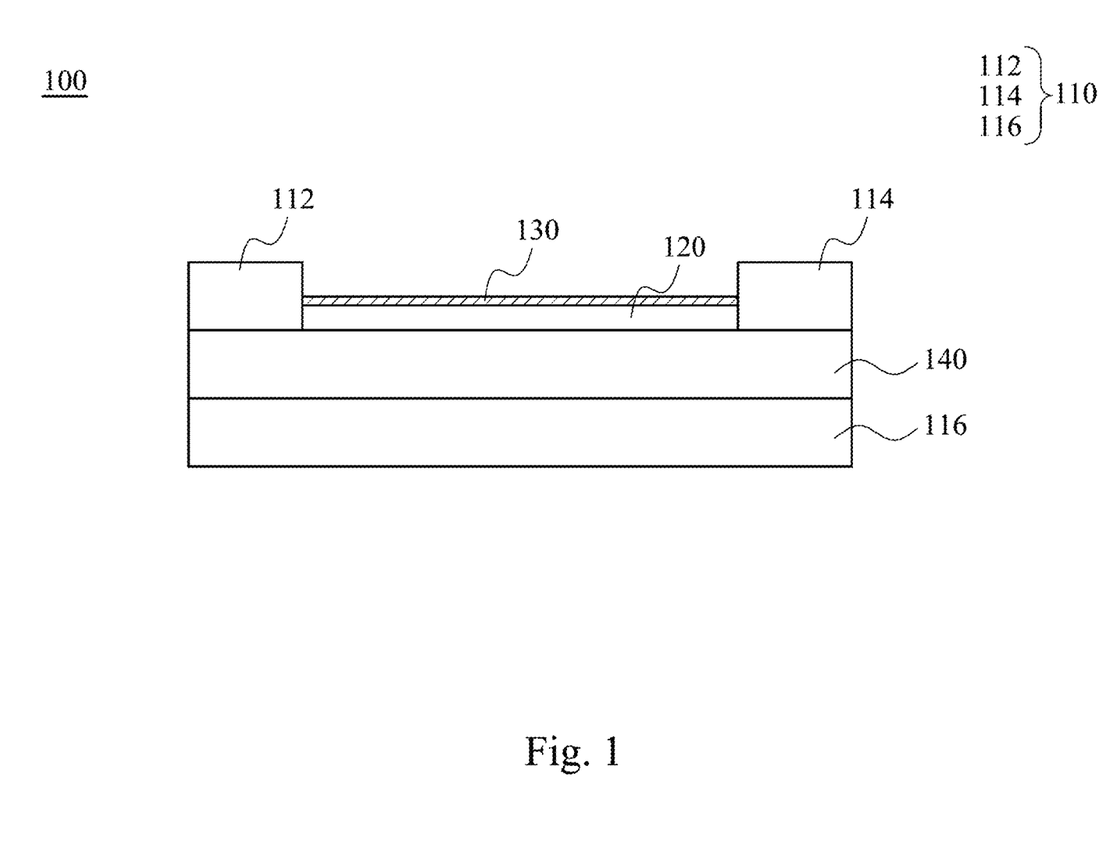
FIG. 1 illustrates a cross-sectional view of a photodetecting device in accordance with one embodiment of the present disclosure.

Please refer to FIG. 1, which illustrates a cross-sectional view of a photodetecting device 100 in accordance of one embodiment of the present disclosure. The photodetecting device 100 includes a transistor 110, a silicon nano-channel 120, a filter dye layer 130 and an isolation layer 140. The transistor 110 includes a source 112, a drain 114 and a gate 116. The silicon nano-channel 120 connects the source 112 and the drain 114 and is configured to receive light. The filter dye layer 130 is over a light-receiving surface of the silicon nano-channel 120. The isolation layer 140 is between the gate 116 and the silicon nano-channel 120.

The gate 116 illustrated in FIG. 1 is at the rear side of the source 112 and the back side of the drain 114. That is, the transistor 110 is a back-gated transistor. According to one embodiment, the transistor 110 is a field-effect transistor (FET).

According to one embodiment, the material of the silicon nano-channel 120 is polycrystalline silicon. The polycrystalline silicon is a material composed of monocrystalline silicon, which can be used for manufacturing semiconductors, flat panel displays or solar cells and has the advantages of mass process and development. The silicon nano-channel 120 may be a silicon nanowire channel, a silicon nanofilm channel or a silicon nanobelt channel.

When the silicon nano-channel 120 is a silicon nanowire channel, the width of the silicon nano-channel 120 is about 50-100 nm. For example, the width can be 50, 55, 60, 65, 70, 75, 80, 85, 90, 95 or 100 nm.

In one embodiment of the present disclosure, the thickness of the silicon nano-channel 120 is about 1-100 nm. For example, the thickness can be 1, 5, 10, 15, 20, 25, 30, 35, 40, 45, 50, 55, 60, 65, 70, 75, 80, 85, 90, 95 or 100 nm.

The filter dye layer 130 allows the light within a specific wavelength range to pass through for the purpose of concentrating the light to the silicon nano-channel 120, thus improving the sensitivity of the photodetecting device 100. After receiving the light with a specific wavelength range, the positions of the electrons and the holes in the silicon nano-channel 120 are rearranged so as to change the current between the source 112 and the drain 114. According to one embodiment, the material of the filter dye layer 130 is silicon dioxide and tantalum pentoxide ($SiO_2+Ta_2O_5$).

The photodetecting device of the present disclosure is a parameter-configurable photodetecting device, which can receive light passing through the silicon nano-channel and/or apply a voltage on the gate of the transistor for regulating the current between the source and the drain of the two terminals of the silicon nano-channel in the transistor. By the current difference before and after light irradiation, the intensity of the light received by the silicon nano-channel can be obtained, and a non-contact regulating mechanism can be provided through regulation of light energy, such that the application field can be broadened in the future. The photodetecting device of the present disclosure may be applied to the application field of low-intensity light detection, such as bioluminescence, luminescence experiment and night vision system. In the future, mass production can be performed by a semiconductor process and directly integrates current semiconductor IC design.

Figure 2:
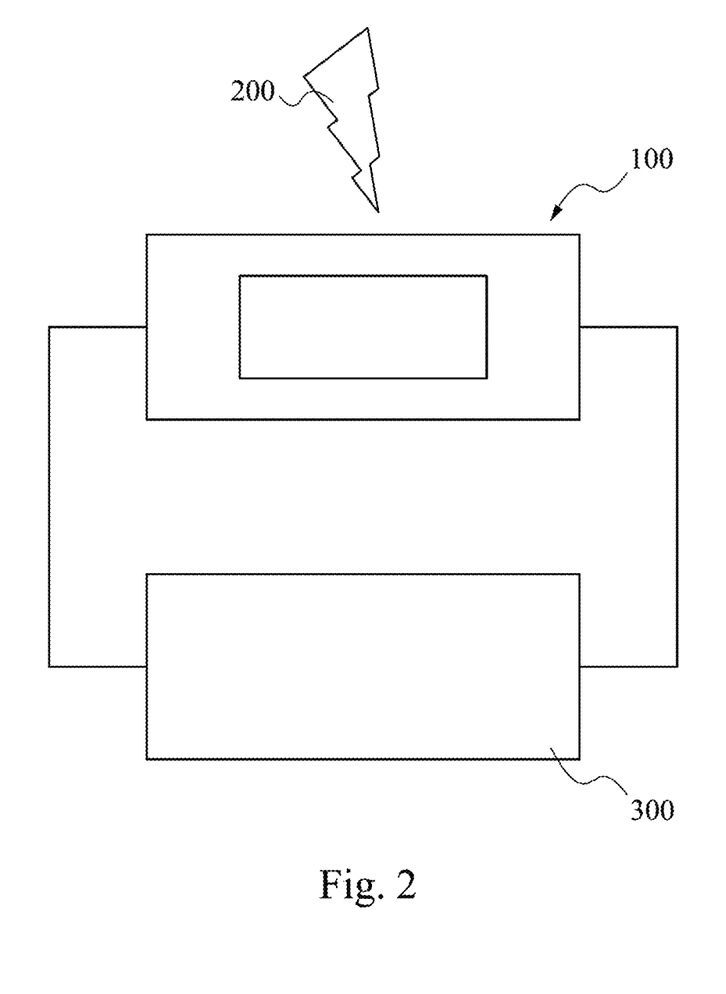
FIG. 2 illustrates a schematic diagram of the photodetecting device measured by a measurement system in accordance with one embodiment of the present disclosure.

Please refer to FIG. 2, which illustrates a schematic diagram of the photodetecting device 100 measured by the measurement system 300 in accordance with one embodiment of the present disclosure. When the light 200 irradiates the photodetecting device 100, the photodetecting device 100 converts light signals into electrical signals by the silicon nano-channel and the transistor. At the same time, the parameter measurement to the electrical signals is performed through the measurement system 300, and then the light intensity received by the photodetecting device 100 can be obtained through calculation.

The source of the light 200 may be bioluminescence, luminescence or self-illumination source. The bioluminescence may be generated by using the pairing theory of biosystems, such as antigen-antibody, biotin-avidin, substrate-receptor or enzyme, and by reacting the two biosystems. For example, biotin-avidin is a common biomolecule pairing system, and the quantity of the avidin in the sample may be detected by using the biotin, where the biotin can be selectively modified and fixed on the filter dye layer. The abovementioned theory may be applied to similar combinations, such that the photodetecting device of the present disclosure can be a multi-type biomolecule detecting element with high sensitivity. Similar combinations, such as antigen-antibody, protein-substrate (e.g., growth hormone or neurotransmitter) and protein-cell (e.g., cancer cell or virus), can be practiced in diagnosing steps of various clinical medical fields.

The measurement system 300 is used to measure and analyze the electrical signal generated by the transistor, which may be an analyzing instrument such as an oscilloscope or a spectrum analyzer for finding electrical properties.

Figure 3A:
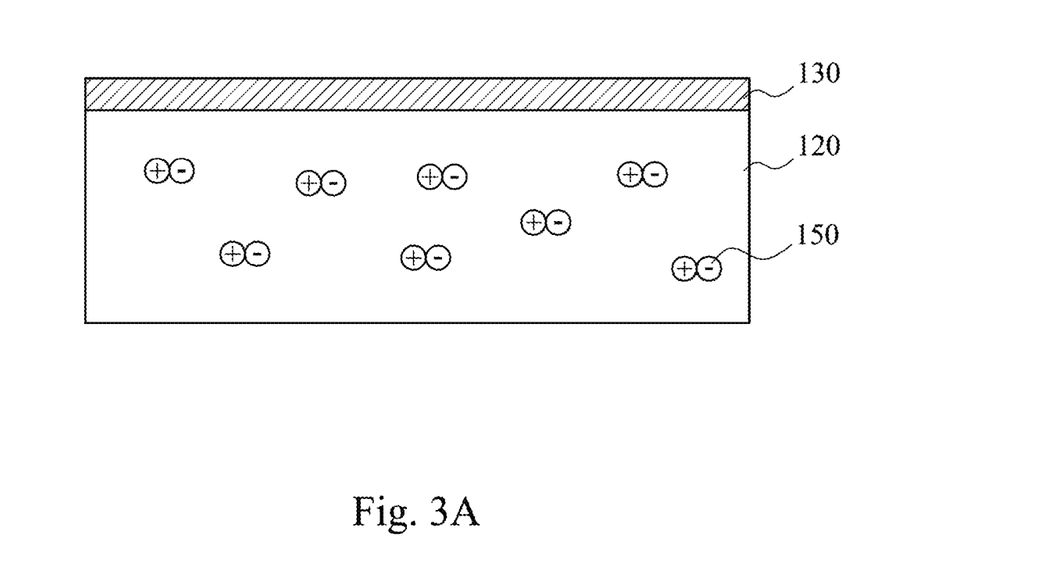
FIGS. 3A-3B illustrate schematic diagrams of the positions of the electrons and the holes arranged in a silicon nano-channel of a photodetecting device before and after light irradiation respectively in accordance with one embodiment of the present disclosure.
Figure 3B:
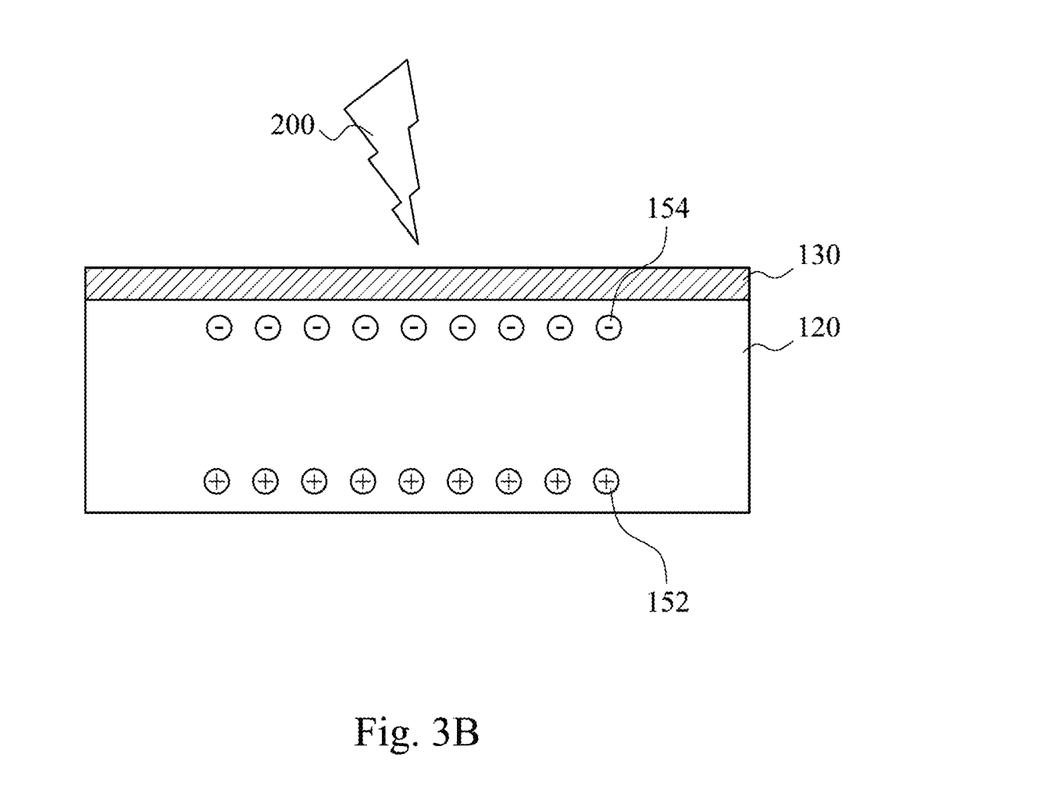

Please refer to FIGS. 3A-3B, which illustrate schematic diagrams of the positions of the electrons and the holes arranged in the silicon nano-channel 120 of the photodetecting device 100 before and after light irradiation respectively in accordance with one embodiment of the present disclosure, where only the silicon nano-channel 120 and the filter dye layer 130 of the photodetecting device 100 are illustrated. Please refer to FIG. 3A, before irradiating the photodetecting device 100, the silicon nano-channel 120 is electrically neutral, and the electrons and the holes therein are paired as the electron-hole pairs 150 and are arranged in parallel. Please refer to FIG. 3B, when the light 200 irradiates onto the filter dye layer 130 and the light 200 within a specific wavelength range passes through the filter dye layer 130, the electron-hole pairs 150 in the silicon nano-channel 120 starts to change. The electrons 154 move toward the surface irradiated by the light 200, while the holes 152 move toward the opposite direction. The positions of the electrons 154 and the holes 152 are rearranged, such that the current condition of the transistor starts to change, thereby detecting the intensity of the light 200. FIGS. 3A-3B exhibit a mechanism of photo detection by using the silicon nano-channel for the photodetecting device of the present disclosure.

The reason why the electrons 154 move toward the surface irradiated by the light 200 is energy level. Because of the energy level, the electrons 154 absorb the energy of the light 200 more easily than the holes 152 and then are stimulated.

Figure 4A:
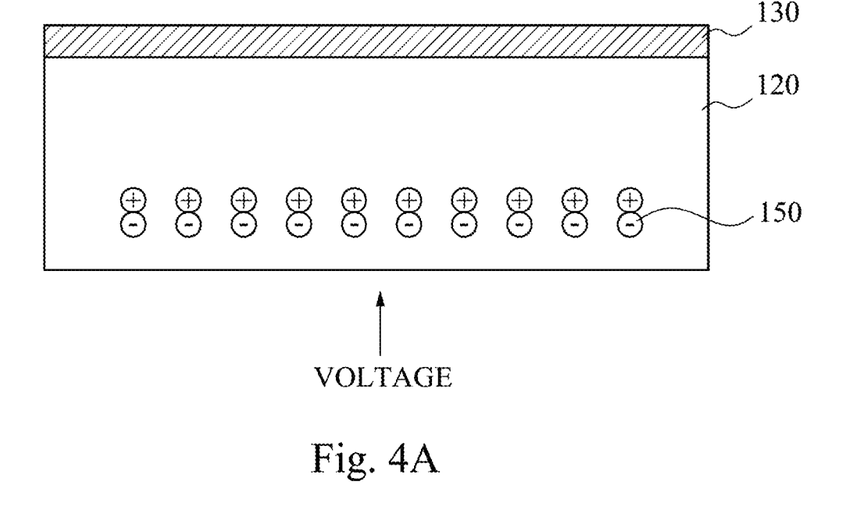
FIGS. 4A-4B illustrate schematic diagrams of the positions of the electrons and the holes arranged in a silicon nano-channel of a photodetecting device before and after light irradiation respectively in accordance with one embodiment of the present disclosure.
Figure 4B:
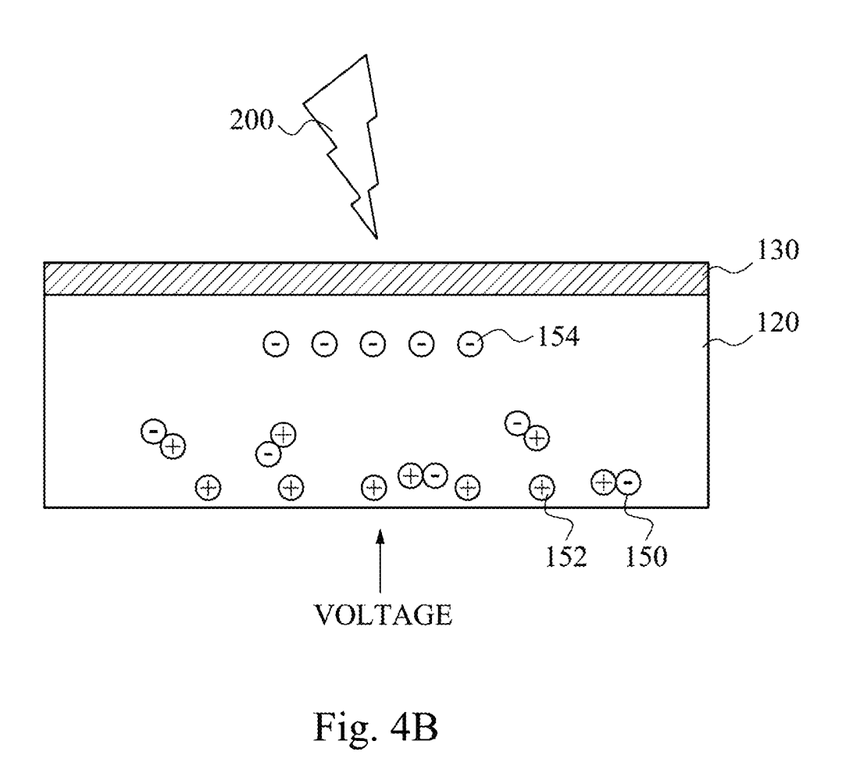

In the present disclosure, the silicon nano-channel is established under the transistor structure, such that the electrical property of the silicon nano-channel can be changed through the theorem of the transistor, which is another mechanism of photo detection by using the silicon nano-channel. Please refer to FIGS. 4A-4B, which illustrate schematic diagrams of the positions of the electrons and the holes arranged in the silicon nano-channel 120 of the photodetecting device 100 before and after light irradiation respectively in accordance with another embodiment of the present disclosure, in which only the silicon nano-channel 120 and the filter dye layer 130 of the photodetecting device 100 are illustrated. Please refer to FIG. 4A. When a gate voltage (n-type, positive gate voltage) is applied on the transistor, the electron-hole pairs 150 in the silicon nano-channel 120 are affected, and the electron-hole pairs 150 are turned and are arranged near the surface of the gate, such that the current is allowed to flow therethrough. At this time, the current is in stable condition. Please refer to FIG. 4B. If at this time the photodetecting device 100 is irradiated by the light 200 again, the arrangement of the electron-hole pairs 150 in the silicon nano-channel 120 may be varied according to the gate voltage. Some electrons 154 move toward the surface irradiated by the light 200, some holes 152 move toward the opposite direction, and some remain paired (i.e., the electron-hole pairs 150). The positions of the electrons 154 and the holes 152 are rearranged, such that the current condition of the transistor changes, thereby detecting the intensity of the light 200. Therefore, in the photodetecting device of the present disclosure, the feature variations generated from receiving light by the silicon nano-channel may also be regulated through the theorem of the transistor, so as to have good sensitivity and improve the applicability and the variability of the photodetecting device.

The photodetecting device is widely used for various applications as small as a camera for mobile phones or as large as an image sensor for remote sensing satellites. It is always an important development direction in the industry to develop a new photodetecting device and improve photosensitivity and stableness. The present disclosure provides a new photodetecting device with high-sensitivity feature of a silicon nano-channel being utilized, such that the light energy changes the features of the electrons and the holes in the silicon nano-channel, thereby detecting the light. Compared to the other apparatus, in the photodetecting device of the present disclosure, the silicon nano-channel is set up and established based on the transistor design, and such structure makes the photodetecting device of the present disclosure not only be irradiated by the light to change the element features but also control the element features by the gate voltage through the theorem of the transistor. More specifically, the photodetecting device of the present disclosure can use the theorem of photo detection and a transistor to regulate element features simultaneously, thereby adjusting the sensitivity or other parameters and extending to other applications.

Figure 5:
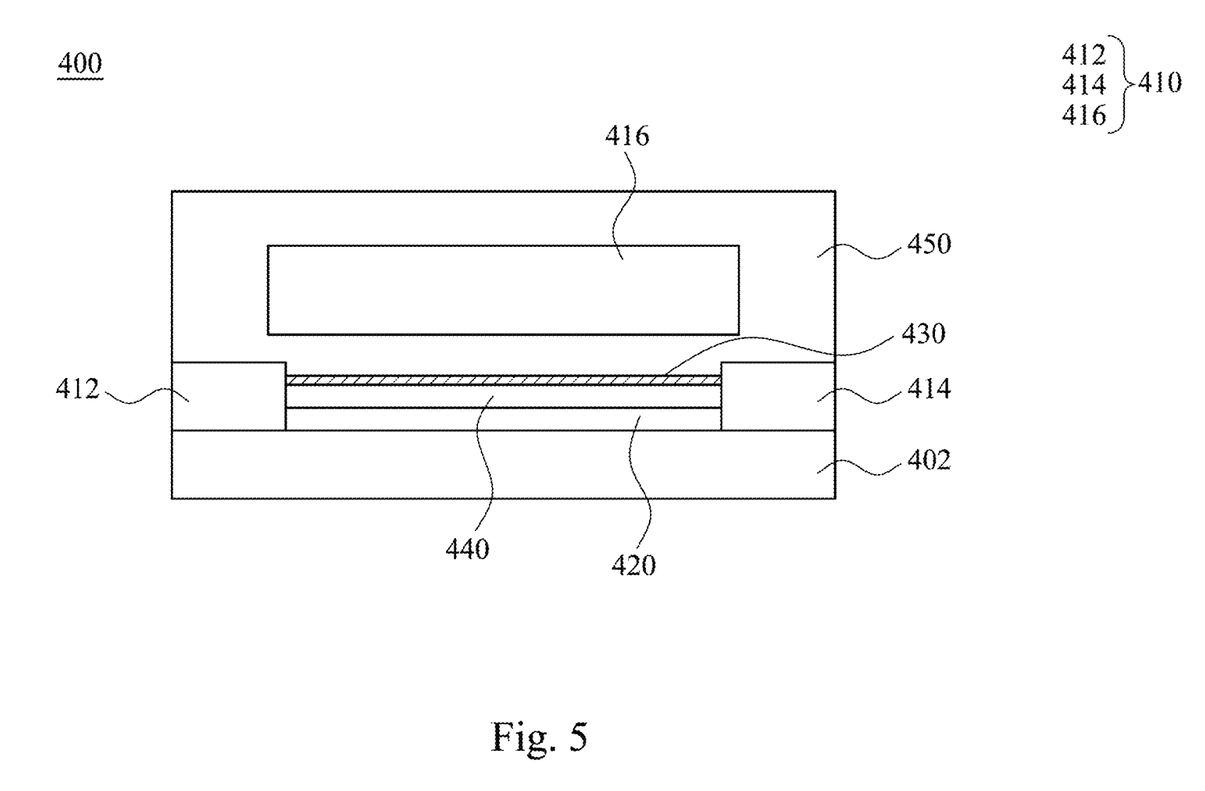
FIG. 5 illustrates a cross-sectional view of a photodetecting device in accordance with one embodiment of the present disclosure.

Please refer to FIG. 5, which illustrates a cross-sectional view of a photodetecting device 400 in accordance with one embodiment of the present disclosure. The photodetecting device 400 includes a substrate 402, a transistor 410, a silicon nano-channel 420, a filter dye layer 430, an isolation layer 440 and a solution 450. The transistor 410 includes a source 412, a drain 414 and a gate 416. The silicon nano-channel 420 connects the source 412 and the drain 414 and is configured to receive light. The filter dye layer 430 is over a light-receiving surface of the silicon nano-channel 420. The isolation layer 440 is between the gate 416 and the silicon nano-channel 420. The solution 450 covers the source 412, the drain 414 and the filter dye layer 430 and wraps around the gate 416.

The gate 416 illustrated in FIG. 5 is wrapped in the solution 450. That is, the transistor 410 is a liquid-gated transistor. In this embodiment, the gate 416 may be needle-shaped and is inserted into the solution 450. According to one embodiment, the solution 450 is an ionic solution, which can be such as an N,N-diethyl-N-methyl-N-methoxyethyl tetrafluoroborate (DEME-BF4) solution, an N, N-diethyl-N-methyl-N-methoxyethyl bis(trifluoromethylsulfonyl)imide (DEME-TFSI) solution, 1,3-bis[tris(hydroxymethyl)methylamino]propane (Bis-Tris propane), a tris(hydroxymethyl) aminomethane hydrochloride (Tris-HCl) solution, 2-morpholinoethane sulfonic acid (MES), a phosphate solution, a carbonate solution, a borate solution, an acetate solution, a citrate solution, or a combination thereof.

The difference between the photodetecting device 400 and the photodetecting device 100 is the position of the gate 416. However, such difference does not affect the feature of each element, and therefore, the photodetecting device 400 has the same advantages and functionalities as the photodetecting device 100.

Figure 6A:
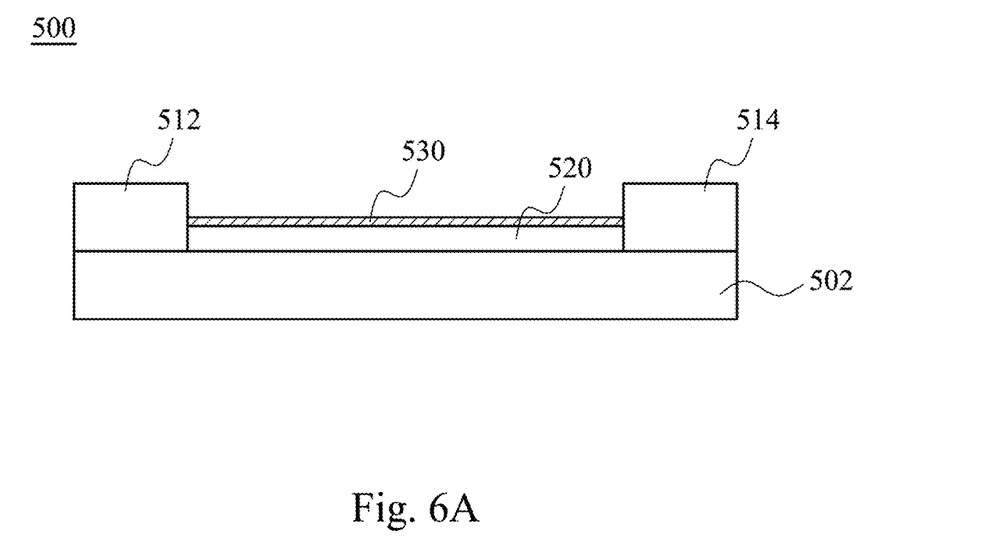
FIGS. 6A-6B respectively illustrate a side view and a top view of the photodetecting device in accordance with one embodiment of the present disclosure.
Figure 6B:
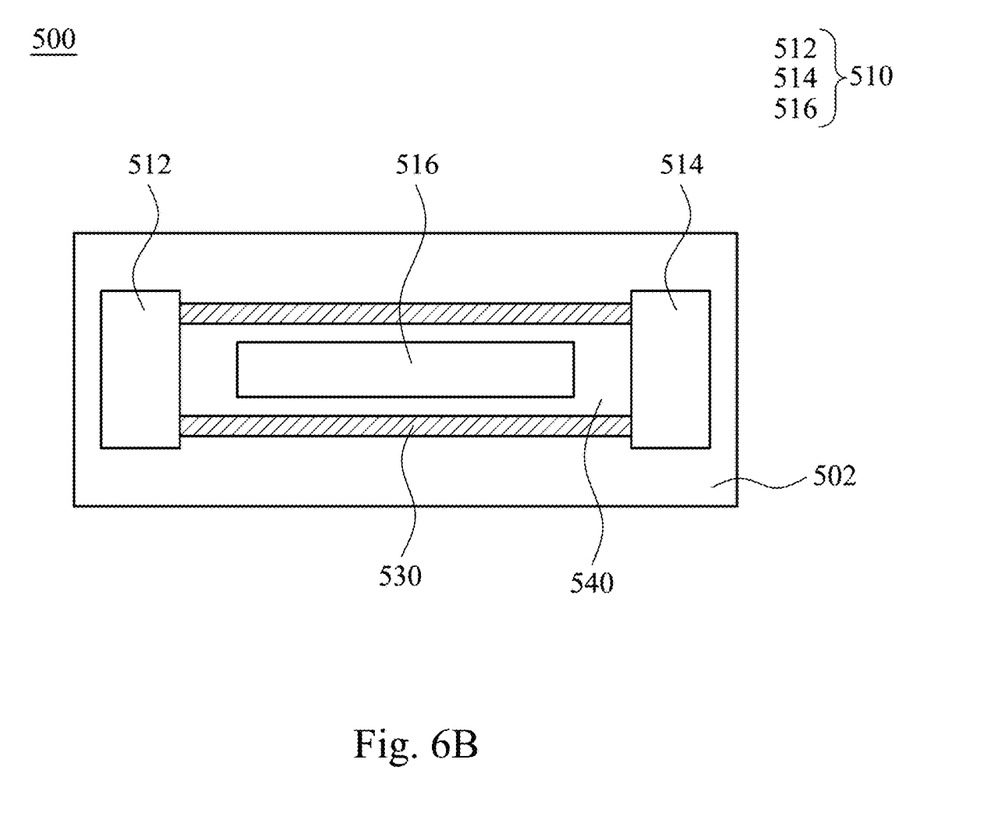

Please refer to FIGS. 6A-6B, which illustrate a side view and a top view of a photodetecting device 500 respectively in accordance with one embodiment of the present disclosure. The photodetecting device 500 includes a substrate 502, a transistor 510, two silicon nanowire channels 520, a filter dye layer 530 and an isolation layer 540. The transistor 510 includes the source 512, the drain 514 and the gate 516. The gate 516 is at a side of the two silicon nanowire channels 520. The silicon nanowire channel 520 connects the source 512 and the drain 514, which is disposed to receive light. The filter dye layer 530 is over a light-receiving surface of the silicon nanowire channels 520. The isolation layer 540 is between the gate 516 and the silicon nanowire channels 520.

The gate 516 illustrated in FIGS. 6A-6B is at a side of the silicon nanowire channels 520. That is, the transistor 510 is a side-gated transistor.

The difference between the photodetecting device 500 and the photodetecting device 100 is the position of the gate 516. However, such difference does not affect the feature of each element, and therefore, the photodetecting device 500 has the same advantages and functionalities as the photodetecting device 100.

Another aspect of the present disclosure is to provide a method of using the abovementioned photodetecting device to perform photo detection, including using light to irradiate the filter dye layer of the photodetecting device and rearranging the positions of the electrons and the holes in the silicon nano-channel by the light with a wavelength range passing through the filter dye layer. The positions of the electrons and the holes are rearranged changing the current between the source and the drain, so as to generate a current difference. The light intensity is calculated by the current difference.

The photo detection method of the present disclosure can be used to detect bioluminescence, and can generate light by reacting the biomolecules desired to be detected in the sample and the receptors, and obtains the biomolecule concentration of the sample via the light intensity calculated by the abovementioned step. The biomolecules and the receptors are a biomolecule pairing system, which can be a composition listed above. In one embodiment, the receptors are modified on the filter dye layer, and the light generated after the reaction between the receptors and the sample can directly irradiate the filter dye layer of the photodetecting device, and then the light within a specific wavelength range passes through the filter dye layer and is absorbed by the silicon nano-channel. In another embodiment, the receptors are not modified on the filter dye layer; instead, the light generated after the reaction between the receptors and the sample approaches the photodetecting device to irradiate the filter dye layer, and then the light within a specific wavelength range passes through the filter dye layer and is absorbed by the silicon nano-channel.

According to one embodiment, the photo detection method further includes applying a voltage on the gate before the light irradiating the filter dye layer of the photodetecting device, such that the positions of the electrons and the holes in the silicon nano-channel are rearranged, thereby forming a stable current between the source and the drain. Then, the filter dye layer of the photodetecting device is irradiated by the light, such that the electrons and the holes in the silicon nano-channel are rearranged again, thereby changing the original stable current condition. The light intensity can be calculated by the generated current difference.

The present disclosure provides a new photo detection method of using a photodetecting device with high-sensitivity feature of a silicon nano-channel being utilized, such that the light directly irradiates on the filter dye layer, and the light energy passing through the filter dye layer changes the element feature of the silicon nano-channel, thereby detecting the light. In addition, the method of the present disclosure can selectively regulate the element feature of the silicon nano-channel through the gate voltage of the transistor, for achieving multifarious application and thereby further improving the sensitivity of photo detection.

As described above, for most of the photosensors, the element feature of the photosensors has been fixed after the photosensors are packaged in a semiconductor factory, and the variation of the light energy affecting the element is often limited, and therefore the application field is more limited. For example, the photosensor with high sensitivity can not have large dynamic range, while the photosensor with normal sensitivity often needs long-time exposure or time to detect weak light for capturing required information.

The technical feature of the photodetecting device and the method of using the same for photo detection of the present disclosure is that the silicon nano-channel with high sensitivity to light is adopted, the element electrical property of the silicon nano-channel is directly changed by the light energy, and the light irradiation condition is obtained through the measured electrical signals. In addition, because the silicon nano-channel is constructed on the transistor structure, the electrical property of the silicon nano-channel itself may also be regulated through an added voltage to the transistor. The photodetecting device of the present disclosure receives light to affect the element features and uses the control mechanism of the transistor to change the features of the element itself as well, eventually being capable of enlarging the application field of the photodetecting device through cross-use. The photodetecting device of the present disclosure has high sensitivity, and is capable of dynamically adjusting the element parameters, so as to have wide application fields and markets.

Manufacture Method of Photodetecting Device

The manufacture method of the photodetecting device in accordance with one embodiment of the present disclosure includes the following steps:

1. Forming a gate on a substrate. In one embodiment, the substrate is silicon wafer, and the material of the gate is polycrystalline silicon. The gate is formed through deposition, such as chemical vapor deposition (CVD), atmospheric pressure CVD (APCVD), low-pressure CVD (LPCVD), plasma enhanced CVD (PECVD) or atomic layer deposition (ALD).

2. Depositing an isolation layer on the gate as a gate dielectric layer. In one embodiment, the deposition method is CVD. The isolation layer may be composed of a single layer oxide or be composed of a layer of oxide and a layer of nitride.

3. Depositing polycrystalline silicon on the isolation layer. The deposition method may refer to the method described in step 1.

4. Etching the polycrystalline silicon to form a silicon nanowire as a channel of the transistor and to form a source and a drain simultaneously. In one embodiment, the etching method is dry etching. In this step, the polycrystalline silicon nanowire channel is formed by the same mask and process defining the source and the drain. The polycrystalline silicon nanowire channel is formed by self-aligning at the same time as defining the source and the drain.

5. Forming a filter dye layer over the silicon nanowire channel, thereby obtaining the photodetecting device of the present disclosure, of which the structure may refer to FIG. 1.

The photodetecting device fabricated by the abovementioned method is used for the following tests.

Reliability Test

Figure 7:
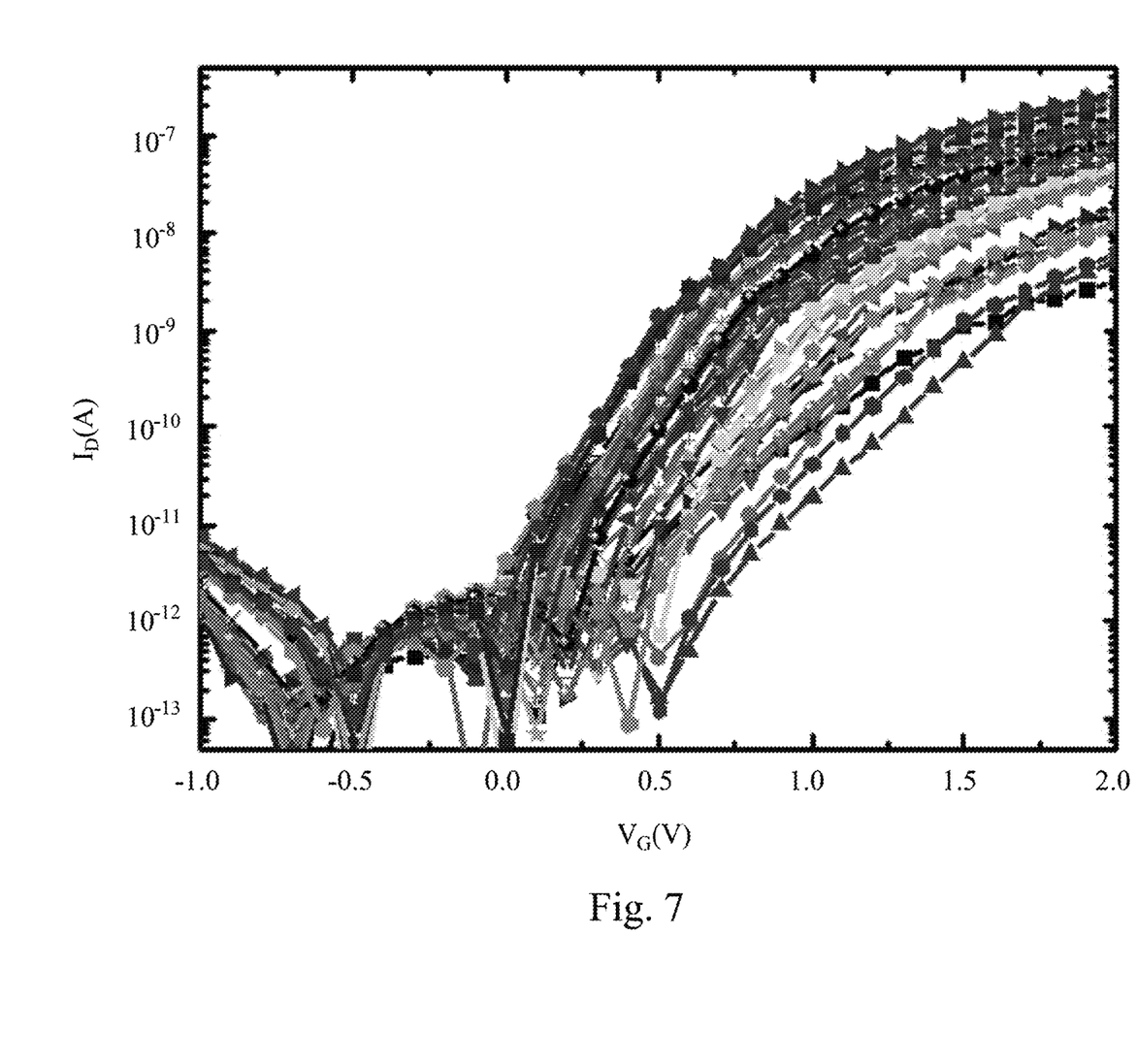
FIG. 7 illustrates a current-voltage relationship plot of the photodetecting device in accordance with one embodiment of the present disclosure.

Please refer to FIG. 7, which illustrates a current-voltage relationship plot of the photodetecting device in accordance with one embodiment of the present disclosure. In this test, 50 fabricated photodetecting devices are used for measuring their electrical properties, where the transistors are n-type transistors. As shown in FIG. 7, in each of the 50 photodetecting devices, the drain current (ID, unit: Ampere) increases as the gate voltage (VG, unit: Volts) increases, showing the electrical property of the n-type transistor. The photodetecting devices of the present disclosure are tested through a long time, and according to the mass fabrication and the comparison result of their electrical reaction, the photodetecting device of the present disclosure are shown to have reproducibility and good reliability.

Sensitivity Test

Figure 8:
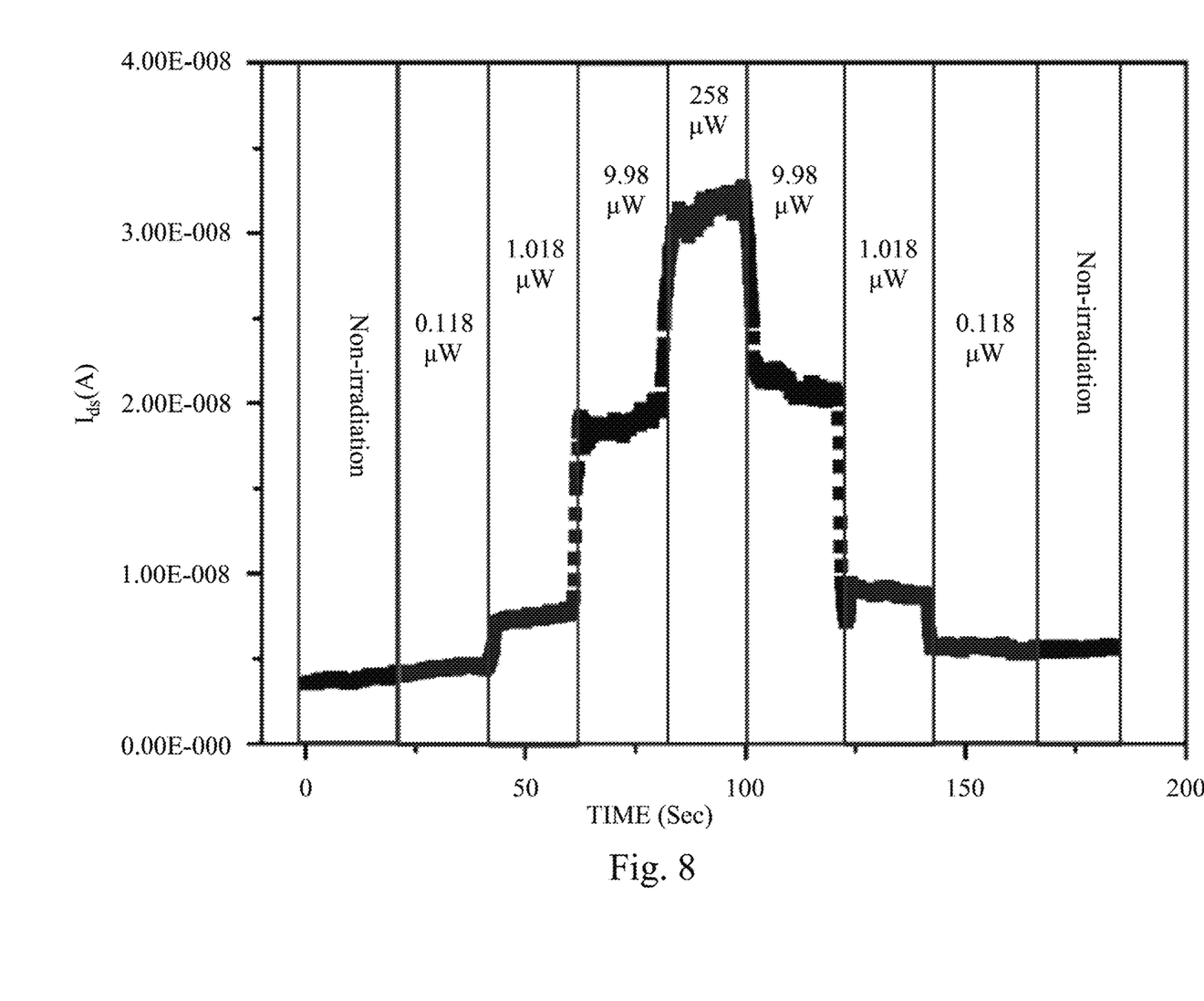
FIG. 8 illustrates a current-time relationship plot of the photodetecting device with various irradiating light energies in accordance with one embodiment of the present disclosure.

Please refer to FIG. 8, which illustrates a current-time relationship plot of the photodetecting device with various irradiating light energies in accordance with one embodiment of the present disclosure. In this test, various light intensities are used to irradiate the surface of the element, and the variation of the reacting current are measured at the same time, where the transistors are p-type transistors. The various light energies include 0.118, 1.018, 9.98 and 258 µW, and the current detected under non-irradiation is used as a comparison. As shown in FIG. 8, the current of the photodetecting device increases providing that the light energy is at least about 1 µW, and the current can increase as the light intensity increases. Then, the current of the photodetecting device decreases as the light energy decreases. This test result shows that the photodetecting device of the present disclosure has the advantages of responding to light, stableness and good sensitivity.

In summary, the present disclosure proposes using a semiconductor process to fabricate a silicon nano-channel structure and designing a transistor structure at a substrate. The distribution of the electrons and the holes in the silicon nano-channel can be affected directly via light energy, causing the feature of the silicon nano-channel to change, converting the light energy into electrical signals and obtaining signal variation by the electrical signal measuring method. Further, the transistor theory may be used to regulate the feature of the silicon nano-channel, for parameter adjustment of light signal measurement in the future. Therefore, the design proposed in the present disclosure can achieve multifarious application via the light energy and transistor regulation methods simultaneously, thereby improving the feature of photo detection. The photodetecting device and the photo detection method of using the photodetecting device of the present disclosure may be applied to many industries, such as optoelectronics industries, biomedical industries, electronics industries or energy industries, and may be used to develop many products, such as photosensor, bioluminescence sensors, image sensors, cameras and industrial detectors.

It will be apparent to those skilled in the art that various modifications and variations can be made to the structure of the disclosure without departing from the scope or spirit of the present disclosure. In view of the foregoing, it is intended that the present disclosure cover modifications and variations of this disclosure provided they fall within the scope of the following claims.

What is claimed is:

1. A method of using a photodetecting device to perform photo detection, comprising:
    providing a photodetecting device comprising:
        a transistor comprising a source, a drain and a gate;
        a polycrystalline silicon nano-channel layer connecting the source and the drain, wherein the polycrystalline silicon nano-channel layer has a light-receiving surface;
        an optical filter layer over the light-receiving surface of the polycrystalline silicon nano-channel layer, wherein the optical filter layer transmits a light within a wavelength range;
        an isolation layer between the gate and the polycrystalline silicon nano-channel layer; and
        a solution covering the source, the drain and the optical filter layer and wrapping around the gate;
    using light to irradiate the optical filter layer of the photodetecting device and rearranging positions of a plurality of electrons and a plurality of holes in the polycrystalline silicon nano-channel layer by the light with a wavelength range capable of passing through the optical filter layer;
    changing a current between the source and the drain by rearranging the positions of the plurality of electrons and the plurality of holes, so as to generate a current difference; and
    calculating the intensity of the light by the current difference.

2. The method of claim 1, further comprising reacting a sample with a receptor to generate the light.

3. The method of claim 2, further comprising modifying the receptor on the filter dye layer.

4. The method of claim 1, before irradiating the optical filter layer of the photodetecting device by the light further comprising applying a voltage on the gate to rearrange the positions of the electrons and the holes in the polycrystalline silicon nano-channel layer and forming a stable current between the source and the drain.

* * * * *